United States Patent [19]

Hamada

[11] 4,426,727
[45] Jan. 17, 1984

[54] FM NOISE REDUCING CIRCUIT

[75] Inventor: Masanori Hamada, Toda, Japan

[73] Assignee: Clarion Co., Ltd., Tokyo, Japan

[21] Appl. No.: 288,551

[22] Filed: Jul. 30, 1981

[30] Foreign Application Priority Data

Aug. 7, 1980 [JP] Japan .................................. 55-107676

[51] Int. Cl.³ ........................... H04B 1/10; H04H 5/00
[52] U.S. Cl. ...................................... 381/13; 455/135; 455/296
[58] Field of Search ............ 179/1 GC, 1 GD, 1 GE, 179/1 GJ; 329/11 D, 131-133, 136; 455/133, 135, 136, 140, 141, 273, 296, 278, 303, 305, 306, 311, 312; 381/13

[56] References Cited

U.S. PATENT DOCUMENTS

| 3,568,078 | 3/1971 | Pelchat | 329/110 |
|---|---|---|---|
| 4,135,159 | 1/1979 | Kubanoff | 455/305 |
| 4,166,251 | 8/1979 | Ishigaki et al. | 329/132 |
| 4,211,979 | 7/1980 | Muraoka et al. | 455/306 |
| 4,266,296 | 5/1981 | Ishigaki | 455/303 |
| 4,326,294 | 4/1982 | Okamoto et al. | 455/273 |
| 4,379,207 | 4/1983 | Kubota | 381/13 X |

Primary Examiner—A. D. Pellinen
Attorney, Agent, or Firm—Flynn, Thiel, Boutell & Tanis

[57] ABSTRACT

An FM noise reducing circuit which comprises an operational amplifier for comparing intermediate frequency signal levels and multipath signal levels, and a multiplexer controlled by output signals from the operational amplifier is arranged to carry out attenuation of high frequency components as well as blending of outputs from right and left channels in response to the output signals of the operational amplifier.

4 Claims, 7 Drawing Figures

FM NOISE REDUCING CIRCUIT

BACKGROUND OF THE INVENTION

1. Field of the Invention

This invention relates to an FM noise reducing circuit for reducing multipath noises.

2. Description of the Prior Art

On receiving an FM broadcasting with an FM receiver, there often occurs interference between waves directly reaching the receiver from a transmitting antenna and reflected waves, i.e. so-called multipath signals, reaching there after being reflected by buildings and the like, thus generating multipath distortion or multipath noises in outputs of the receiver. Those multipath noises are large in an FM radio receiver for use in an automotive vehicle which receives a broadcast while running and it is difficult to avoid such noises.

In this connection, there have conventionally been proposed means of attenuating high range components in response to signal intensity or blending both outputs from the right and left channels. These means are certainly effective in regions where the electric field is weak. However, they are not effective enough for multipath noises generated in regions where the electric field is intermediate or strong.

OBJECT OF THE INVENTION

It is therefore an object of the present invention to provide an FM noise reducing circuit capable of attenuating high range components as well as blending outputs from the right and left channels in response to the results obtained by constantly carrying out a comparison of an intermediate frequency signal level and a multipath signal level.

SUMMARY OF THE INVENTION

In accordance with the present invention, there is provided an FM noise reducing circuit comprising:
  an FM radio receiver means;
  a detecting circuit for detecting signal levels and multipath signal levels in said radio receiver means;
  a comparator means for comparing signal levels and multipath signal levels supplied from said detecting means; and
  a control means for controlling operations for attenuating high frequency components of detection signals in said FM radio receiver means and blending outputs from right and left channels in response to outputs from said comparator means.

DETAILED DESCRIPTION OF THE PREFERRED EMBODIMENTS

The present invention will now be described in detail referring to the preferred embodiments illustrated in the accompanying drawings.

Figure 1:
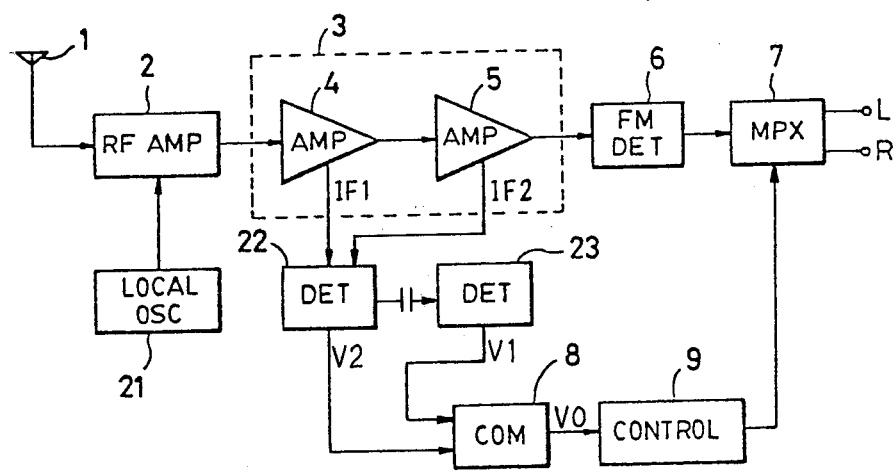
FIG. 1 is a schematic block diagram of an FM receiver which embodies the present invention.

FIG. 1 shows a schematic diagram of an FM receiver according to the present invention in which the reference numeral 1 designates an antenna, 2 a high frequency amplifier stage and 3 an intermediate frequency amplifier stage comprising a first amplifier 4 and a second amplifier 5. Further, the reference numeral 6 denotes an FM wave detecting stage, 7 a multiplexer, 8 an operational amplifier comprising a subtracting circuit for performing comparative operation of output signals from the first amplifier 4 and the second amplifier 5, and 9 a control circuit for controlling the multiplexer 7 in response to control signals supplied from the operational amplifier 8, respectively.

Figure 2:
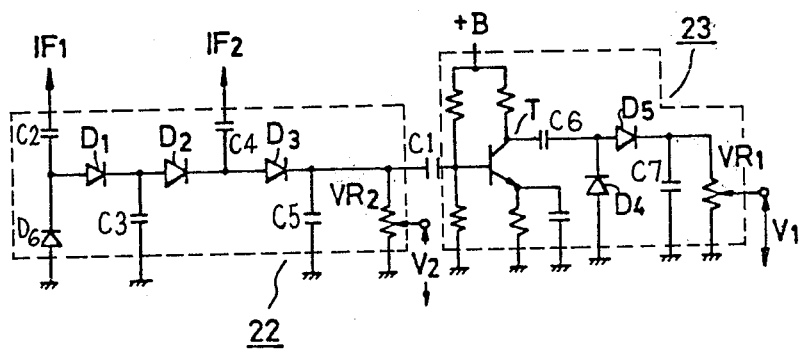
FIG. 2 is a schematic diagram of two detector circuits which are components of the receiver of FIG. 1.

The reference numerals 22 and 23 are detectors for detecting signal levels of the signals from the intermediate frequency amplifier stage 3 and the multipath signal levels, respectively. A structural example of the detectors 22, 23 is shown in FIG. 2. Output signals from the first amplifier 4 (intermediate frequency signals) are applied to a terminal $IF_1$ and outputs signals from the second amplifier 5 (intermediate frequency signals) are applied to a terminal $IF_2$. The signals at $IF_1$ and $IF_2$ each include multipath distortion. Then, those signals are submitted to detection by diodes $D_1$–$D_3$ and the detected signals are applied to a variable resistor $VR_2$, from which IF (intermediate frequency) signal levels $V_2$ are obtained. Capacitor $C_1$ carries the ac component of the signal at $VR_2$ to detector 23, where it is amplified by a transistor T, then rectified by diodes $D_4$, $D_5$, and as a result, amplitude modulation components in the IF stage 22 are applied to the variable resistor $VR_1$, from which multipath signal levels $V_1$ are obtained.

As shown in FIG. 2, the detector 22 includes a diode $D_6$, the anode of which is connected to ground and the cathode of which is connected through a capacitor $C_2$ to the signal output $IF_1$ from amplifier stage 3. The anode of diode $D_1$ is connected to the cathode of diode $D_6$, and a capacitor $C_3$ is connected between the cathode of diode $D_1$ and ground. The anode of diode $D_2$ is connected to the cathode of diode $D_1$, and the cathode of diode $D_2$ is connected to the anode of diode $D_3$ and, through a capacitor $C_4$, to the signal output $IF_2$ of amplifier stage 3. A capacitor $C_5$ is connected between the cathode of diode $D_3$ and ground, and variable resistor $VR_2$ is connected in parallel with capacitor $C_5$. The IF signal level $V_2$ is taken from the slider of variable resistor $VR_2$. A capacitor $C_1$ connects the cathode of diode $D_3$ to an amplifier circuit in the detector 23 which has a single transistor T. The collector of the transistor T is connected through a capacitor $C_6$ to the cathode of diode $D_4$ and the anode of diode $D_5$. The anode of diode $D_4$ is connected to ground. A capacitor $C_7$ is connected between ground and the cathode of diode $D_5$, and variable resistor $VR_1$ is connected in parallel with capacitor $C_7$. The multipath signal level $V_1$ is taken from the slider of variable resistor $VR_1$.

The detected IF signal levels $V_2$ and multipath signal levels $V_1$ are applied to the operational amplifier 8 for being submitted to comparative operation therein as shown in FIG. 3A. In particular, the multipath signal level $V_1$ is subtracted from the IF signal level $V_2$, and the resulting signal appears at the output of the operational amplifier 8.

In FIG. 3(A), under the condition $R_1=R_2$ and $R_2=R_4$, the output voltage $V_0$ is represented by $V_0=R_2/R_1 (V_2-V_1)$.

The output voltage $V_0$ is thus obtained, taking into consideration the electric field intensity and the multipath disturbance, to serve as a control voltage for controlling the multiplexer 7.

FIG. 3(B) shows a summing circuit for extracting the multipath signal levels $V_1$ as a negative voltage and summing it to the IF signal levels $V_2$, thus obtaining the control voltage. For example, when the output voltage $V_0$ is small, the control circuit 9 controls the multiplexer 7 so as to allow it to attenuate high range components of the detected outputs and to blend the outputs from the right and left channels. Such control manner depends not only on the IF signal levels $V_2$ but also on the multipath signal levels $V_1$, and therefore, the circuit operation thus controlled makes it possible to improve the S/N ratio.

Figure 3:
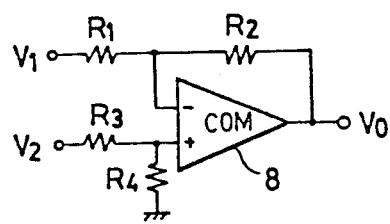
FIG. 3(A) is a schematic diagram of a comparator circuit which is a component of the receiver of FIG. 1.
FIG. 3(B) is a schematic diagram of an alternative embodiment of the circuit of FIG. 3(A)
Figure 3:
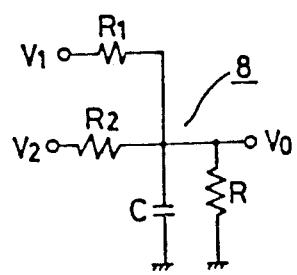
Figure 4:
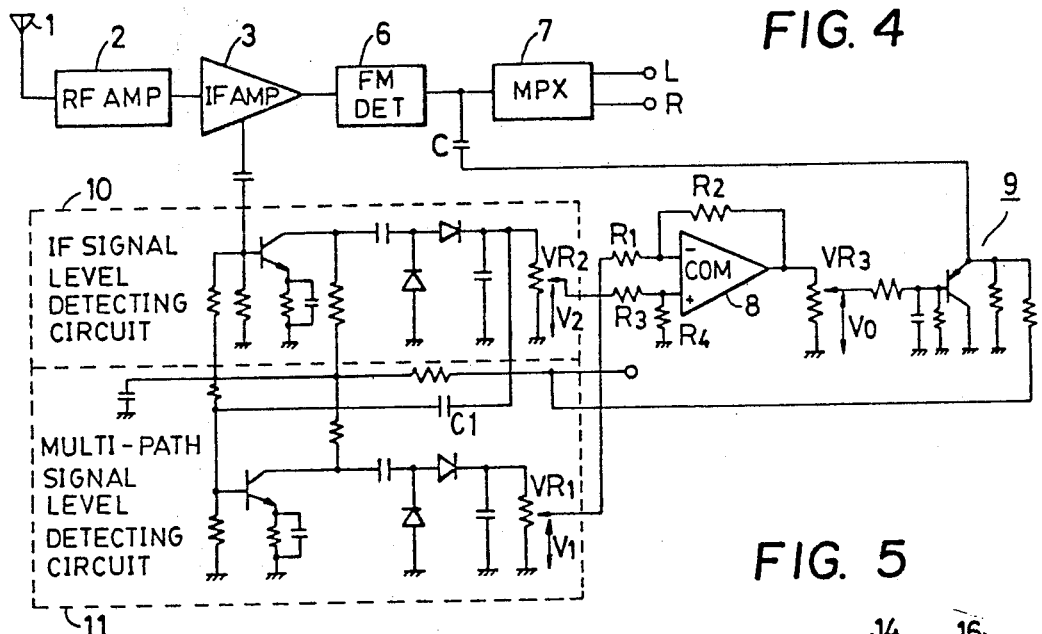
FIG. 4 is a schematic block diagram of an alternative embodiment of the receiver of FIG. 1.

FIG. 4 shows a circuit diagram illustrating another embodiment according to the present invention in which portions the same as those of FIGS. 1-3 are designated by the same reference numerals. The outputs from the intermediate frequency amplifier stage 3 are applied to an IF signal level detecting circuit 10 and a multipath signal level detecting circuit 11. The ac component of the signal at the variable resistor $VR_2$ is supplied to the input of detecting circuit 11 by capacitor $C_1$. The IF signal level $V_2$ is detected at a variable resistor $VR_2$ and the multipath signal level $V_1$ at a variable resistor $VR_1$, respectively, and both are then applied to the operational amplifier 8 to be submitted to comparative operation. The control voltage $V_0$ obtained at a variable resistor $VR_3$ is applied to the multiplexer 7 from the control circuit 9 through a capacitor C for eliminating high frequency components. Thus, the attenuation of high range components of the detected outputs and the blending operation of the outputs of the right and left channels can be achieved.

Figure 5:
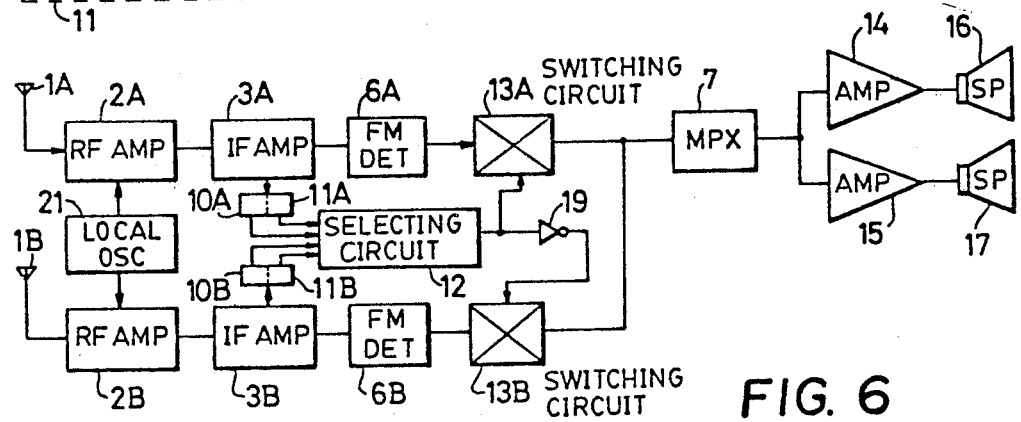
FIG. 5 is a schematic block diagram of a further embodiment of the receiver of FIG. 1.
Figure 6:
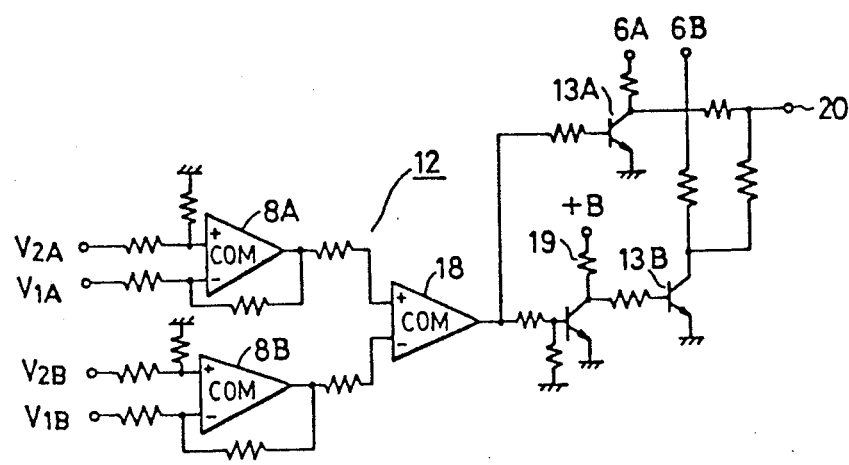
FIG. 6 is a schematic diagram of a selecting circuit which is a component of the receiver of FIG. 5.

FIGS. 5 and 6 illustrate a further embodiment according to the present invention which is applied to an antenna switching circuit in a diversity reception system. FIG. 5 shows a schematic diagram of a diversity receiver in which there are provided two sets of receiving circuits having a same structure. One of the receiving circuits causes one of the switching circuits 13A and 13B to operate in response to outputs from a selecting circuit 12, thereby allowing the other receiving circuit to operate. The outputs from the multiplexer 7 are put out as voice from the right and left loudspeakers 16, 17 through respective right and left low frequency amplifiers 14 and 15. FIG. 6 shows an example of the selecting circuit 12, the inverter 19 and the switching circuits 13A, 13B of FIG. 5. In this example, two kinds of IF signal levels $V_2A$, $V_2B$ obtained from the intermediate frequency amplifier stages 3A, 3B and multipath signal levels $V_1A$, $V_1B$ are applied to differential amplifiers 8A, 8B. The outputs from the differential amplifiers 8A, 8B are then applied to a comparator 18. The output from the comparator 18 allows the switching circuit 13A, directly, or the switching circuit 13B, through the inverter 19, to operate, and then, the outputs obtained at an output terminal 20 are applied to the multiplexer 7. Incidentally, the reference numeral 21 in FIG. 5 denotes a local oscillator connected to the high frequency amplifier stages 2A, 2B.

As apparent from the above description, according to the present invention, by submitting signal levels and multipath signal levels to constant comparative operation and by carrying out attenuation of high range components and blending operation between outputs of right and left channels, it is possible to effectively reduce multipath noises. Multipath disturbance is increased in accordance with the rise of modulation frequency, increase of frequency variation, increase of phase difference between two kinds of waves interfering with each other and equalization of amplitudes of the two kinds of waves. However, according to the present invention, multipath noises caused by disturbance can be reduced in any case.

Further, the reducing circuit according to the present invention is advantageous since it can be commonly used as a circuit for improving S/N proportion. It is also applicable for making a determination of switching time of an antenna switching circuit in a diversity reception system.

I claim:

1. An FM noise reducing circuit, comprising an FM radio receiver which includes a high frequency amplifier stage having an input to which is applied an FM input signal having right and left components and a multipath distortion component, an intermediate frequency amplifier stage connected to an output of said high frequency amplifier stage, an FM wave detecting stage connected to an output of said intermediate frequency amplifier stage and multiplexing circuit means connected to an output of said FM wave detecting stage and having at least one output; a detecting circuit which is connected to at least one output of said intermediate frequency amplifier stage and produces an IF signal level and a multipath signal level; comparator means responsive to said detecting circuit for subtracting said multipath signal level from said IF signal level; and control means responsive to said comparator means and connected to a control input of said multiplexing circuit for causing said multiplexing circuit means to attenuate high frequency components of signals from said FM wave detecting stage and to blend said right and left components of such signals so as to effectively reduce said multipath distortion component at said output of said multiplexing circuit means.

2. The circuit according to claim 1, wherein said detector circuit includes a first diode having its anode connected to ground, a first capacitor connected between the cathode of said first diode and a first said output of said intermediate frequency amplifier stage, a second diode having its anode connected to the cathode of said first diode, a second capacitor connected between ground and the cathode of said second diode, a third diode having its anode connected to the cathode of said second diode, a third capacitor connected between the cathode of said third diode and a second said output of said intermediate frequency amplifier stage, a fourth diode having its anode connected to the cathode of said third diode, a fourth capacitor connected between ground and the cathode of said fourth diode, a first variable resistor connected in parallel with said fourth capacitor, a fifth capacitor connected between the cathode of said fourth diode and an input of an amplifier circuit, a sixth capacitor connected between an output of said amplifier circuit and the cathode of a fifth diode, the anode of said fifth diode being connected to ground, a sixth diode having its anode connected to the cathode of said fifth diode, a seventh capacitor connected between ground and the cathode of said sixth diode, and a second variable resistor connected in parallel with said seventh capacitor, said IF signal level and said multipath signal level being respectively derived from the sliders of said first and second variable resistors.

3. The circuit according to claim 2, wherein said comparator means includes an operational amplifier, said IF signal level being applied to one input of said operational amplifier and said multipath signal level being applied to a further input thereof, said control means being responsive to a signal from an output of said operational amplifier.

4. An FM noise reducing circuit, comprising first and second FM radio receiver means which respectively include first and second high frequency amplifier stages which each have an input to which is applied a respective FM input signal having right and left components and a multipath distortion component, first and second intermediate frequency amplifier stages which are respectively connected to outputs of said first and second high frequency amplifier stages, first and second FM wave detecting stages which are respectively connected to outputs of said first and second intermediate frequency amplifier stages, and first and second switching means respectively connected to outputs of said first and second FM wave detecting stages; multiplexing circuit means connected to outputs of said first and second switching means; first detecting means for deriving a first intermediate frequency signal level and a first multipath signal level from an output of said first intermediate frequency amplifier stage; second detecting means for deriving a second intermediate frequency signal level and a second multipath signal level from an output of said second intermediate frequency amplifier stage; first comparator means responsive to said first detecting means for subtracting said first multipath signal level from said first intermediate frequency signal level; second comparator means responsive to said second detecting means for subtracting said second multipath signal level from said second intermediate frequency signal level; third comparator means for comparing an output from said first comparator means to an output from said second comparator means; and means responsive to said third comparator means for enabling a selected one of said first and second switching means so that a signal from the corresponding one of said first and second FM wave detecting stages is supplied to said multiplexing circuit means, said multiplexing circuit means attenuating high frequency components of and blending said left and right components of signals from said selected one of said switching circuits so as to effectively reduce said multipath distortion component therein at an output of said multiplexer circuit means.

* * * * *